United States Patent
Shan (10) Patent No.: US 11,342,178 B2
(45) Date of Patent: May 24, 2022

(54) METHODS OF MANUFACTURING LOW-TEMPERATURE POLYSILICON THIN FILM AND TRANSISTOR

(71) Applicant: HKC CORPORATION LIMITED, Guangdong (CN)

(72) Inventor: Jianfeng Shan, Chongqing (CN)

(73) Assignee: HKC CORPORATION LIMITED, Guangdong (CN)

( * ) Notice: Subject to any disclaimer, the term of this patent is extended or adjusted under 35 U.S.C. 154(b) by 100 days.

(21) Appl. No.: 16/754,422

(22) PCT Filed: Nov. 9, 2017

(86) PCT No.: PCT/CN2017/110107
§ 371 (c)(1),
(2) Date: Apr. 8, 2020

(87) PCT Pub. No.: WO2019/071692
PCT Pub. Date: Apr. 18, 2019

(65) Prior Publication Data
US 2020/0321213 A1    Oct. 8, 2020

(30) Foreign Application Priority Data

Oct. 12, 2017   (CN) .......................... 201710945731.7

(51) Int. Cl.
*H01L 21/02* (2006.01)
*H01L 29/66* (2006.01)

(52) U.S. Cl.
CPC .. *H01L 21/02513* (2013.01); *H01L 21/02502* (2013.01); *H01L 21/02532* (2013.01); *H01L 21/02675* (2013.01); *H01L 29/66757* (2013.01)

(58) Field of Classification Search
CPC ......... H01L 21/02513; H01L 21/02502; H01L 21/02532; H01L 21/02675; H01L 29/66757; H01L 21/02422; H01L 21/02658; H01L 21/02667; H01L 29/78675; H01L 21/02664
See application file for complete search history.

(56) References Cited

U.S. PATENT DOCUMENTS

2015/0155390 A1* 6/2015 Wang .................. H01L 29/6675
257/66
2017/0062633 A1* 3/2017 Carlson ........... H01L 31/022441

FOREIGN PATENT DOCUMENTS

| CN | 1501449 A | 6/2004 |
|----|-----------|--------|
| CN | 1588621 A | 3/2005 |
| CN | 103219228 A | 7/2013 |

(Continued)

OTHER PUBLICATIONS

Google NPL Search (Year: 2022).*

*Primary Examiner* — Yasser A Abdelaziez
(74) *Attorney, Agent, or Firm* — Muncy, Geissler, Olds & Lowe, P.C.

(57) ABSTRACT

A method of manufacturing a low temperature polysilicon thin film, including: forming a buffer layer on a substrate; forming a silicon layer on the buffer layer; providing a mask; patterning the silicon layer through the mask, wherein the patterned silicon layer includes a plurality of recrystallization growth spaces; and annealing the silicon layer to form a polysilicon layer, and a partial silicon material of the polysilicon layer is formed on the recrystallization growth space.

12 Claims, 5 Drawing Sheets

(56) References Cited

FOREIGN PATENT DOCUMENTS

| | | | |
|---|---|---|---|
| CN | 103887244 | A | 6/2014 |
| CN | 104064451 | A | 9/2014 |
| CN | 107195636 | A | 9/2017 |
| CN | 107910263 | A | 4/2018 |
| CN | 107919268 | A | 4/2018 |
| CN | 107946173 | A | 4/2018 |
| JP | 2008004812 | A | 1/2008 |

* cited by examiner

METHODS OF MANUFACTURING LOW-TEMPERATURE POLYSILICON THIN FILM AND TRANSISTOR

BACKGROUND

Technology Field

This disclosure relates to methods of manufacturing a silicon thin film and a transistor, and more particularly to methods of manufacturing a low temperature polysilicon thin film and a transistor.

Description of Related Art

Flat panel displays have been widely used in various fields. The liquid crystal display device has superior features including the thin body, low power consumption and radiationless feature, has been gradually replaced the conventional cathode ray tube display device, and is applied to many kinds of electronic products, such as a mobile phone, a portable multimedia device, a notebook computer, a liquid crystal television, a liquid crystal screen and the like.

The liquid crystal display device includes elements such as a display panel and the like. At present, an active matrix type liquid crystal display panel is a general display panel, which includes an active matrix substrate, an opposing substrate, and a liquid crystal layer interposed between the two substrates. The active matrix substrate has a plurality of row wires, column wires and pixels, the pixels have pixel drive elements, and the pixel drive elements are connected to the row wires and the column wires. A general pixel drive element is a thin film transistor, and the row wires and the column wires are usually metal wires.

Thin film transistors of an active matrix substrate may be divided into conventional amorphous silicon thin film transistors and low temperature polysilicon thin film transistors having the better conductive capacity. The low temperature polysilicon process often employs the excimer laser annealing technology, that is, the excimer laser is used as a heat source, and the laser beam irradiates the amorphous silicon thin film to make the amorphous silicon recrystallize and transform into the polysilicon structure. Because the whole process is completed below 600° C., the general glass substrate is applicable. However, the surface of the polysilicon layer tends to have protrusions using the laser annealing, and the sizes of the protrusions affect the current properties of the transistor. This results in different operating properties of the transistors on the panel, and results in a decrease in the display quality.

SUMMARY

In view of the deficiencies of the prior art, the inventor has obtained this disclosure after the research and development have been made. An objective of this disclosure is to provide methods of manufacturing a low temperature polysilicon thin film and a transistor, which can improve the protruding problem on the surface of the low temperature polysilicon thin film.

This disclosure provides a method of manufacturing a low temperature polysilicon thin film, comprising: forming a buffer layer on a substrate; forming a silicon layer on the buffer layer; providing a mask; patterning the silicon layer through the mask, wherein the patterned silicon layer comprises a plurality of recrystallization growth spaces; and annealing the silicon layer to form a polysilicon layer, and a partial silicon material of the polysilicon layer is formed on the recrystallization growth space.

In one embodiment, a portion of the patterned silicon layer functions as a trench area, and the recrystallization growth spaces are located on a lateral side of the portion.

In one embodiment, the method further comprises a step of: roughening a surface of the silicon layer to form an uneven surface as another recrystallization growth space.

In one embodiment, the step of roughening the surface of the silicon layer is to etch the surface of the silicon layer.

In one embodiment, a surface of the buffer layer has a plurality of pores, and a partial silicon material of the polysilicon layer is filled into the pores.

In one embodiment, the step of forming the buffer layer on the substrate comprises: forming a first sub-buffer layer on the substrate; and forming a second sub-buffer layer on the first sub-buffer layer, wherein a meticulous degree of the second sub-buffer layer is lower than a meticulous degree of the first sub-buffer layer.

In one embodiment, the first sub-buffer layer is a diffusion barrier layer.

In one embodiment, the method further comprises a step of: roughening the buffer layer to form the pores on the surface of the buffer layer before forming the silicon layer on the buffer layer.

In one embodiment, the annealing is laser annealing.

This disclosure provides a method of manufacturing a low temperature polysilicon thin film transistor, comprising: the steps of the method of manufacturing the low temperature polysilicon thin film as mentioned above; forming a gate insulating layer on the polysilicon layer; forming a gate on the gate insulating layer; and forming a source electrode and a drain electrode, wherein the source electrode and the drain electrode are electrically connected to the polysilicon layer.

In summary, because the methods of manufacturing the low temperature polysilicon thin film and the transistor of this disclosure provide the amorphous silicon with the recrystallization growth space, the squeeze between the crystals can be eased in the amorphous silicon recrystallization process, and thus the sizes of the protrusions of the surface of the polysilicon layer are significantly smaller. In the preferred case, the aspect ratio of the protrusions is smaller than 0.3 and even smaller than 0.2. Thus, the protruding problem on the surface of the low temperature polysilicon thin film can be improved.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up", "down", "left", "right", "vertical", "horizontal", "top", "bottom", "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first", and "second" are used for the illustrative purpose only and cannot be understood as indicating or implying the relative importance or implicitly specifying the number of indicated technical features. Therefore, the features restricted by "first" and "second" may expressly or implicitly comprise one or a plurality of ones of the features. In the description of this disclosure, unless otherwise described, the meaning of "a plurality of" comprises two or more than two. In addition, the terms "comprises" and any modification thereof intend to cover the non-exclusive inclusions.

In the description of this disclosure, it needs to be described that, unless otherwise expressly stated and limited, the terms "mount", "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one", "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

This disclosure will be further described below with reference to the accompanying drawings and preferred embodiments.

Figure 1A:
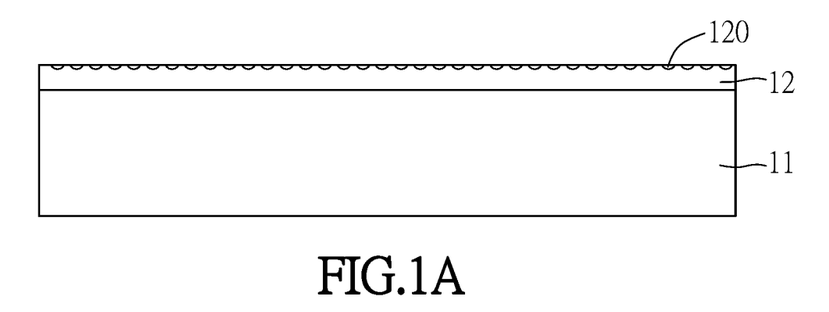
FIGS. 1A to 1C are schematic views showing an embodiment of a method of manufacturing a low temperature polysilicon thin film of this disclosure.
Figure 1B:
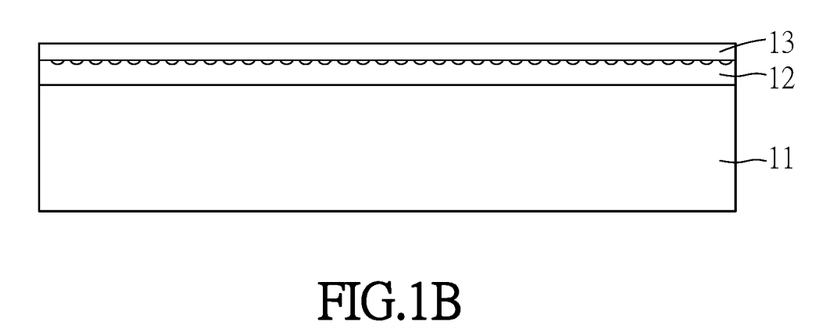
Figure 1C:
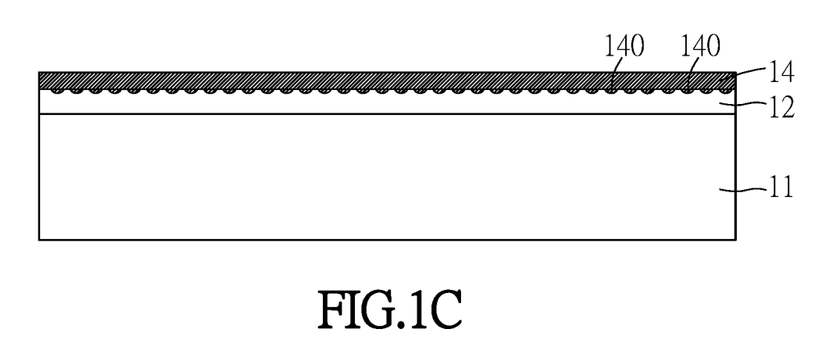

FIGS. 1A to 1C are schematic views showing an embodiment of a method of manufacturing a low temperature polysilicon thin film of this disclosure. As shown in FIG. 1A, a method of manufacturing a low temperature polysilicon thin film firstly provides a substrate 11, and the substrate 11 is, for example, a glass substrate. Then, a buffer layer 12 is formed on the substrate 11. A surface of the buffer layer 12 has a plurality of pores, and the pores may function as the space for subsequent recrystallization of a silicon layer.

In addition, before forming the silicon layer on the buffer layer 12, the manufacturing method may further include a step of roughening the buffer layer 12 to form pores on the surface of the buffer layer 12, wherein the aperture is smaller than 20 nm, for example. The roughened surface is an uneven surface.

As shown in FIG. 1B, a silicon layer 13 is formed on the buffer layer 12. At this time, most of the silicon layer 13 is formed on the surface of the buffer layer 12, and the pores of the buffer layer 12 still have the space not filled with the material of the silicon layer 13. The silicon layer 13 may be deposited on the buffer layer 12 using conventional methods, and the material of the silicon layer 13 is an amorphous silicon.

As shown in FIG. 1C, after the amorphous silicon layer 13 is formed, the annealing is performed on the silicon layer 13 to form a polysilicon layer 14 with a partial silicon material 140 of the polysilicon layer 14 being filled into the pores 120.

The annealing is, for example, laser annealing, the annealing process temperature is below 600 degrees Celsius, and the polysilicon thin film obtained using this process may be called as the low temperature polysilicon (referred to as LTPS). Compared with the process temperature up to 1000 degrees Celsius of the early polysilicon thin film, the process temperature of the low temperature polysilicon is lower. Therefore, the material of the substrate is less restricted. For example, a glass substrate may be used as the substrate 11.

The manufacture of the polysilicon layer 14 converts the original amorphous silicon layer into a polysilicon layer by the annealing process, such as the laser crystallization or the excimer laser annealing (referred to as ELA) and the like. In the annealing process, amorphous silicon in the silicon layer 13 is melted and then recrystallized and rearranged to become polysilicon and thus to form the polysilicon layer 14, a plurality of protrusions are formed on the surface of the polysilicon layer 14, and the protrusions may be formed on the upper surface or the lower surface of the polysilicon layer 14.

As the amorphous silicon is recrystallized, a portion of the amorphous silicon firstly functions as the recrystallized seeds, and then grows into larger crystals, and these crystals continuously grow and are combined to form the larger crystals. However, in the combining process, because the stresses of the crystals interact with one another, a portion of the crystals is pushed onto the surface of the polysilicon layer 14 to form protrusions.

Since the buffer layer 12 leaves the pores 120 for the recrystallization protrusions, at least the protrusions 140 on the lower surface of the polysilicon layer 14 may be filled into the pores 120. The pore 120 also constrains the size and the shape of the protrusion 140 to prevent the protrusion from getting oversized. Although protrusions (not shown) are also formed on the upper surface of the polysilicon layer 14, since the portion of the protrusions is changed to the lower surface of the polysilicon layer 14, the protruding situations on the upper surface are improved. The aspect ratio of the protrusions of the polysilicon layer of the conventional process is about 0.45, and compared with the conventional process, the aspect ratio of the protrusions of the polysilicon layer 14 can be reduced to be smaller than 0.3, and can even be reduced to be smaller than 0.2. Although there are protrusions on the upper and lower surfaces of the polysilicon layer 14, the aspect ratios of the protrusions are not too large to affect the performance of elements.

Figure 1D:
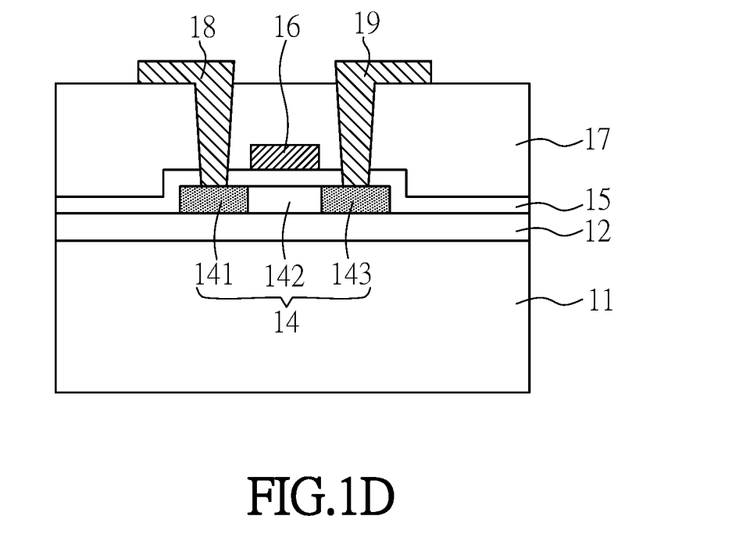
FIG. 1D is a schematic view showing an embodiment of a method of manufacturing a low temperature polysilicon thin film transistor of this disclosure.

FIG. 1D is a schematic view showing an embodiment of a method of manufacturing a low temperature polysilicon thin film transistor of this disclosure. As shown in FIG. 1D, after forming the polysilicon layer 14 on the substrate 11 as shown in FIG. 1C, the subsequent process is performed to form a thin film transistor. The method of manufacturing the low temperature polysilicon thin film transistor includes steps of: forming a gate insulating layer 15 on the polysilicon layer 14; and forming a gate 16 on the gate insulating layer 15; and forming a source electrode 18 and a drain electrode 19, wherein the source electrode and the drain electrode are electrically connected to the polysilicon layer.

For example, the low temperature polysilicon thin film transistor includes the polysilicon layer 14, the gate insulating layer 15, the gate 16, a dielectric layer 17, the source electrode 18 and the drain electrode 19. The polysilicon layer 14 is firstly patterned and the patterned polysilicon layer 14 includes three areas including a source 141, a drain 143 and a trench area 142, and the trench area 142 is located between the source 141 and the drain 143. Then, the gate insulating layer 15 is formed above the patterned polysilicon layer 14 and the substrate 11, wherein the material of the gate insulating layer 15 is, for example, silicon oxide or silicon nitride. Next, the gate 16 is formed above the gate insulating layer 15 and the trench area 142. Then, a dielectric layer 17 is formed on the gate 16 and the gate insulating layer 15, the dielectric layer 17 and the gate insulating layer 15 are patterned to form through holes, and the through holes may expose the source 141 and the drain 143. Then, the source electrode 18 and the drain electrode 19 are formed on the surface of the dielectric layer 17 and the through holes, the source electrode 18 passes through the through hole to contact the source 141, and the drain electrode 19 passes through the through hole to contact the drain 143. Therefore, the source electrode 18 and the drain electrode 19 are electrically connected to the source 141 and the drain 143 of the polysilicon layer 14, respectively.

In addition, the low temperature polysilicon thin film transistor is not limited to the use in a liquid crystal display panel or an organic light emitter diode panel.

In addition, the substrate 11 may be composed of glass, quartz, or similar materials. The buffer layer 12 may be composed of materials such as $SiN_x$, $SiO_x$ or $SiO_xN_y$, and the like.

Figure 2A:
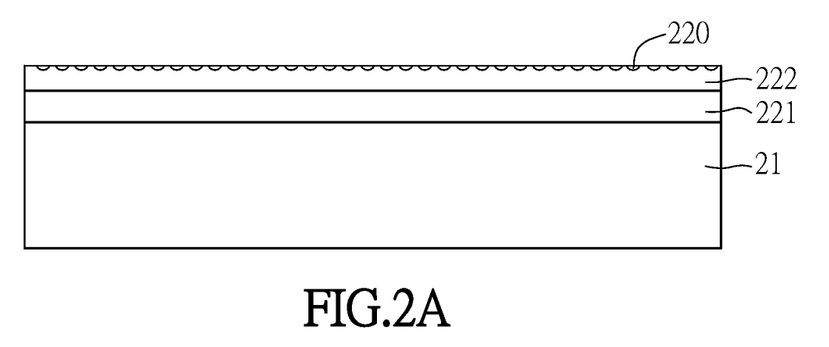
FIGS. 2A to 2C are schematic views showing an embodiment of a method of manufacturing a low temperature polysilicon thin film of this disclosure.
Figure 2B:
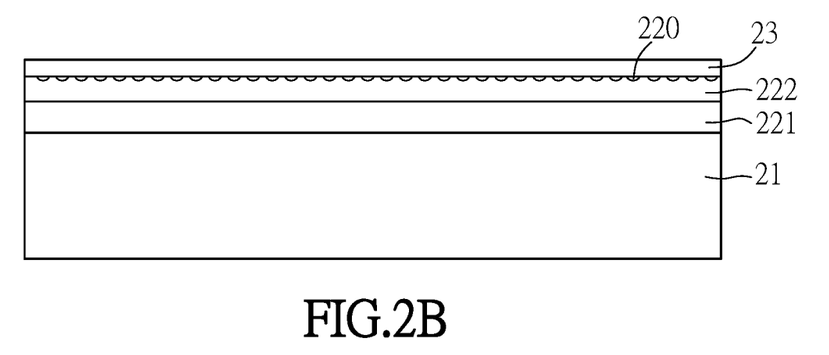
Figure 2C:
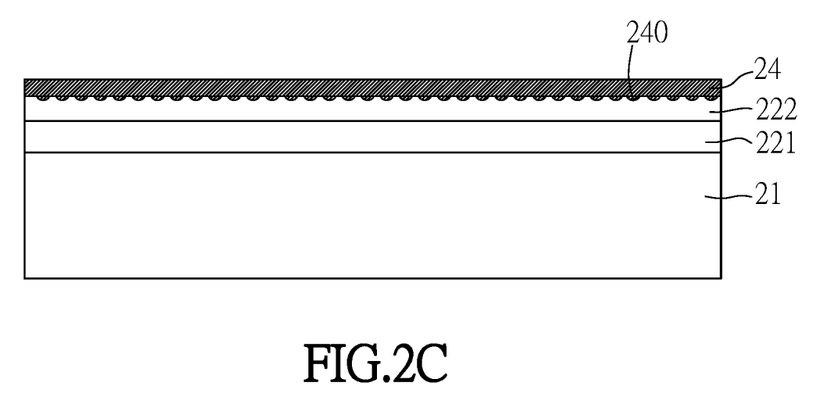

FIGS. 2A to 2C are schematic views showing an embodiment of a method of manufacturing a low temperature polysilicon thin film of this disclosure. As shown in FIG. 2A, a method of manufacturing a low temperature polysilicon thin film firstly provides a substrate 21, and the substrate 21 is, for example, a glass substrate. Then, a buffer layer 22 is formed on the substrate 21. A buffer layer 22 may be a multi-layer structure. In this embodiment, two layers are taken as an example, but the number of layers is not limited to two, and more layers may be provided.

The buffer layer 22 includes a first sub-buffer layer 221 and a second sub-buffer layer 222. The step of forming the buffer layer 22 includes: forming the first sub-buffer layer 221 on a substrate 21, and then forming the second sub-buffer layer 222 on the first sub-buffer layer 221.

These sub-buffer layers may have different meticulous degrees, the uppermost sub-buffer layer in the buffer layer 22 may have a lower meticulous degree, thereby forming the pores on the upper surface of the uppermost sub-buffer layer to function as the space required by the recrystallization of the silicon layer. For example, the meticulous degree of the second sub-buffer layer 222 is lower than that of the first sub-buffer layer 221. Therefore, the upper surface the second sub-buffer layer 222 has a plurality of pores 220, and the pores 220 may function as the space for subsequent recrystallization of the silicon layer.

In addition, before forming the silicon layer on the buffer layer, the manufacturing method may roughen the second sub-buffer layer 222 to form pores on the surface of the buffer layer, wherein the aperture is smaller than 20 nm, for example. The roughened surface is an uneven surface.

Roughening may include etching, etching may be dry etching or wet etching, the process parameters of the dry etching include frequency, pneumatic, ion density, etch time and the like, and the process parameters of the wet etching include the solution concentration, etch time, reaction temperature, stirring of the solution and the like. The etched surface may have different roughnesses by adjusting the etch parameters.

The mask pattern transfer is not needed in the process of the roughening, the photoresist needs not to be disposed on the buffer layer, and the mask and exposure are also not needed.

The first sub-buffer layer is a diffusion barrier layer. Because impurities in the substrate 21 may be diffused to other layers in the annealing process, a diffusion barrier layer may block at least a portion of the impurities to prevent the excessive impurities from diffusing to the silicon layer. The first sub-buffer layer has a higher meticulous degree than the second sub-buffer layer to have the better diffusion barrier effect.

In addition, before the second sub-buffer layer 222 is formed, the first sub-buffer layer 221 may be roughened by using the manufacturing method to have the better diffusion barrier effect. The roughened surface is an uneven surface.

As shown in FIG. 2B, a silicon layer 23 is formed on the second sub-buffer layer 222 of the buffer layer 22. At this time, most of the silicon layer 23 is formed on the surface of the second sub-buffer layer 222, and the pores of the buffer layer 12 still have the space not filled with the material of the silicon layer 23. The silicon layer 23 may be deposited on the second sub-buffer layer 222 using conventional methods, and the material of the silicon layer 23 is an amorphous silicon.

As shown in FIG. 2C, after the amorphous silicon layer 23 is formed, the annealing is performed on the silicon layer 23 to form a polysilicon layer 24 with a partial silicon material 240 of the polysilicon layer 24 being filled into the pores 220 of the second sub-buffer layer 222. Because the formation and the structure of a polysilicon layer 24 are similar to the polysilicon layer 14, detailed descriptions thereof will be omitted.

After forming the polysilicon layer 24, the subsequent process may also be performed, as shown in FIG. 1D, to form the thin film transistor. The method of manufacturing a transistor may refer to the relevant description of FIG. 1D, and detailed descriptions thereof will be omitted.

In addition, the substrate 21 may be composed of glass, quartz, or similar materials. The sub-layer of the buffer layer 22 may be composed of materials such as $SiN_x$, $SiO_x$ or $SiO_xN_y$, and the like.

In addition, in FIGS. 1A and 2A, the manufacturing method of the low temperature polysilicon thin film may further include: roughening surfaces of silicon layers 13 and 23 to form uneven surfaces functioning as a recrystallization growth space, for example, the surface roughness of the roughened surface ranges from 5 nm to 30 nm. Partial silicon materials of the polysilicon layers 14 and 24 are formed into the recrystallization growth space. The step of roughening the surfaces of the silicon layers 13 and 23 is, for example, etching the surfaces of the silicon layers 13 and 23. Due to the provision of more recrystallization growth spaces, the squeeze between the crystals in the recrystallization process can be relieved and the size of the protrusions on the surfaces of the polysilicon layers 14 and 24 can be significantly reduced.

Roughening may include etching, etching may be dry etching or wet etching, the process parameters of the dry etching include frequency, pneumatic, ion density, etch time and the like, and the process parameters of the wet etching include the solution concentration, etch time, reaction temperature, stirring of the solution and the like. The etched surface may have different roughnesses by adjusting the etch parameters.

The mask pattern transfer is not needed in the process of the roughening, the photoresist needs not to be disposed on the buffer layer, and the mask and exposure are also not needed.

In addition, in FIGS. 1B and 2B, the manufacturing method of the low temperature polysilicon thin film may further include: providing a mask before the step of annealing the silicon layer to form the polysilicon layer; and patterning the silicon layer through the mask, wherein the patterned silicon layer comprises a plurality of recrystallization growth spaces. The recrystallization growth spaces are located on the lateral side of the patterned silicon layer. Due to the provision of more recrystallization growth spaces, the squeeze between the crystals in the recrystallization process can be relieved and the size of the protrusions on the surfaces of the polysilicon layers 14 and 24 can be significantly reduced.

The pattern on the silicon layer is transferred through a mask pattern transfer process. For example, an entire layer of photoresist is firstly deposited on an unpatterned silicon layer, then the photoresist is exposed by the mask, and the mask pattern is transferred to the photoresist firstly. Then, the etching process is used to etch the silicon layer, which is not protected by the photoresist, so that the mask pattern is transferred to the silicon layer.

In addition, a portion of the transferred pattern on the silicon layer functions as a trench area, and the recrystallization growth space is left on the lateral side of the portion. For example, the mask pattern is used to define positions of the source, the drain, the trench area and the recrystallization growth space on the silicon layer. After the mask pattern is transferred to the silicon layer, if the silicon layer is viewed from the top of the substrate, the trench area is flatly located between the source and the drain, the recrystallization growth space is located on the lateral side of the trench area of the silicon layer, and even the recrystallization growth space may be located on the lateral sides of the source and the drain of the silicon layer at the same time.

In addition, in order to leave more recrystallization growth spaces, the lateral side surface may also be roughened by etching in the mask pattern transfer process to form more uneven surfaces functioning as a recrystallization growth space, for example, the surface roughness of the roughened surface ranges from 5 nm to 30 nm.

In addition, in FIGS. 1B and 2B, the manufacturing method of the low temperature polysilicon thin film may further include: forming a trap layer on the silicon layers 13 and 23 before the silicon layers 13 and 23 are annealed to form the polysilicon layers 14 and 24. Because the impurities of the substrates 11 and 21 may diffuse when being annealed, the trap layer may be provided to trap these impurities and to prevent the impurities form accumulating on the polysilicon layers 14 and 24. The material of the trap layer is, for example, the material such as $SiN_x$, $SiO_x$ or $SiO_xN_y$, or the like. For example, the trap layer may be achieved by adjusting the process parameters. For example, the low-density $SiO_x$ film layer may be formed by adjusting the ratio of reactants $SiH_4$ to $N_2O$ or the ratio of reactants TEOS to $O_2$ or $O_3$. In general, the proportion of $SiH_4$ is larger, the porous nature of the $SiO_x$ film layer is increasing; and if the proportion of gas gets smaller, the density of the $SiO_x$ film layer gets smaller.

In summary, in the method of manufacturing the low temperature polysilicon thin film and the transistor, due to the provision of the amorphous silicon with the recrystallization growth space, the squeeze between the crystals can be eased in the amorphous silicon recrystallization process, and thus the sizes of the protrusions of the surface of the polysilicon layer are significantly smaller. In the preferred case, the aspect ratio of the protrusions is smaller than 0.3 and even smaller than 0.2.

In addition, because the aspect ratios of the protrusions of the surface of the polysilicon layer are smaller than 0.3, the properties of the elements may be more consistent. When such a low temperature polysilicon thin film transistor is employed as a switch or driver of a display panel, the color uniformity of the display panel can be better.

Figure 3A:
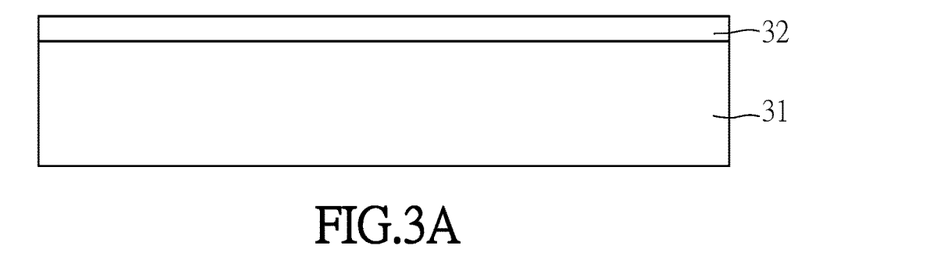
FIGS. 3A to 3D are schematic views showing an embodiment of a method of manufacturing a low temperature polysilicon thin film of this disclosure.

FIGS. 3A to 3D are schematic views showing an embodiment of a method of manufacturing a low temperature polysilicon thin film of this disclosure. As shown in FIG. 3A, the manufacturing method provides a substrate 31, and the substrate 31 is, for example, a glass substrate. Then, a buffer layer 32 is formed on the substrate 31.

Figure 3B:
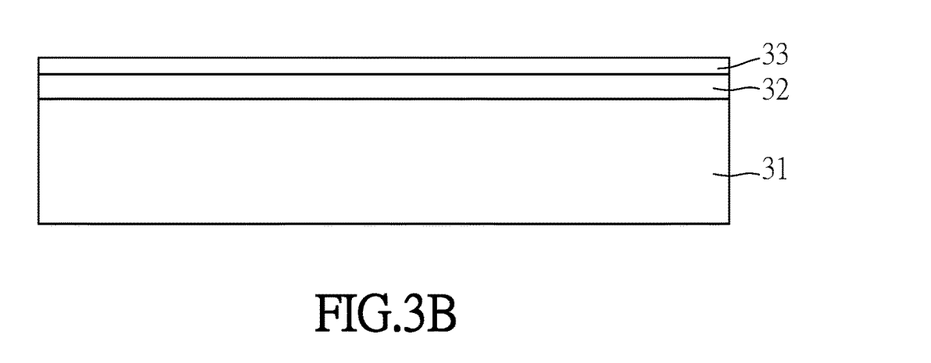

As shown in FIG. 3B, the manufacturing method includes roughening surfaces of the silicon layer 33 to form uneven surfaces functioning as a recrystallization growth space, for example, the surface roughness of the roughened surface ranges from 5 nm to 30 nm. Roughening the surfaces of the silicon layer 33 is, for example, etching the surfaces of the silicon layer 33. The silicon layer 33 may be deposited on the buffer layer 32 using conventional methods, and the material of the silicon layer 33 is an amorphous silicon.

Figure 3C:
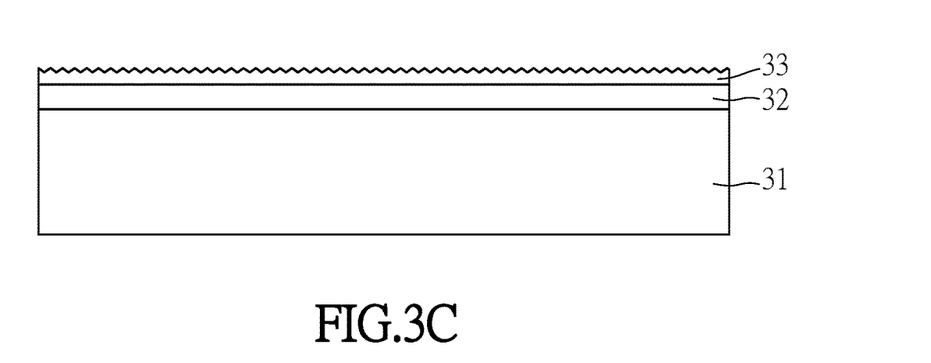
Figure 3D:
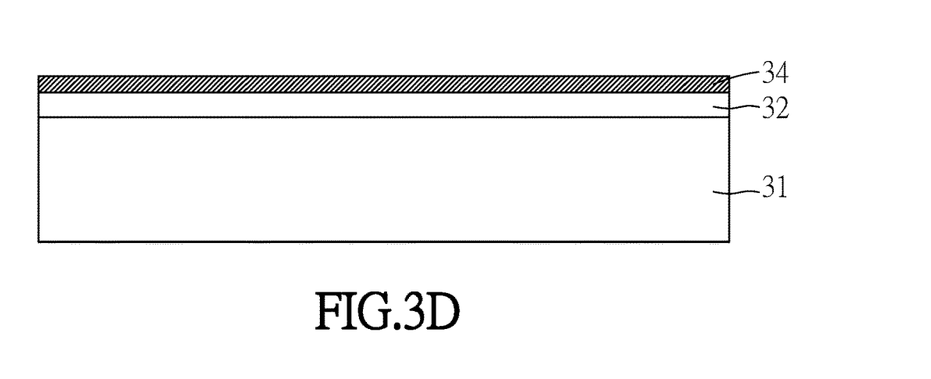

As shown in FIG. 3C, a silicon layer 33 is annealed by the manufacturing method to form a polysilicon layer 34, and a partial silicon material of the polysilicon layer 34 is formed on the recrystallization growth space.

The annealing is, for example, laser annealing. The relevant descriptions of the annealing and recrystallization of amorphous silicon may refer to the relevant contents of FIG. 1C, and detailed descriptions thereof will be omitted.

Because the silicon layer 33 itself retains the recrystallization growth space for the recrystallization protrusions, at least the protrusions on the upper surface of the polysilicon layer 34 may be filled into the recrystallization growth space. The aspect ratio of the protrusions of the polysilicon layer of the conventional process is about 0.45, and compared with the conventional process, the aspect ratio of the protrusions of the polysilicon layer 34 can be reduced to be smaller than 0.3, and can even be reduced to be smaller than 0.2 to alleviate the influence of the protrusions on the element performance.

After forming the polysilicon layer 34, the subsequent process may also be performed, as shown in FIG. 1D, to form the thin film transistor. The method of manufacturing a transistor may refer to the relevant description of FIG. 1D, and detailed descriptions thereof will be omitted.

In addition, the buffer layer 32 may also employ the implementation method of FIGS. 1A and 2A.

For example, the buffer layer 32 may also employ the implementation method of FIG. 1A. The surface of the buffer layer 32 has a plurality of pores, and the pores may function as the space for subsequent recrystallization of the silicon layer, and a partial silicon material of the annealed polysilicon layer is filled into the pores. For example, after forming the silicon layer 33 on the buffer layer 32, the manufacturing method may further include roughening the buffer layer 32 to form the pores on the surface of the buffer layer 32. The relevant implementation method may refer to the relevant description of the FIG. 1A, and detailed descriptions thereof will be omitted.

The buffer layer 32 may also employ the implementation method of the FIG. 2A. The step of forming the buffer layer 32 includes: forming a first sub-buffer layer on the substrate 31; and forming a second sub-buffer layer on the first sub-buffer layer, wherein the meticulous degree of the second sub-buffer layer is lower than that of the first sub-buffer layer. The first sub-buffer layer may be a diffusion barrier layer. The relevant implementation method may refer to the relevant description of the FIG. 2A, and detailed descriptions thereof will be omitted.

In addition, in FIG. 3B, the manufacturing method of the low temperature polysilicon thin film may further include: providing a mask before the step of annealing the silicon layer to form the polysilicon layer; and patterning the silicon layer through the mask, wherein the patterned silicon layer comprises a plurality of recrystallization growth spaces. The recrystallization growth spaces are located on the lateral side of the patterned silicon layer. Due to the provision of more recrystallization growth spaces, the squeeze between the crystals in the recrystallization process can be relieved and the size of the protrusions on the surfaces of the polysilicon layer 34 can be significantly reduced.

In addition, in FIG. 3B, the manufacturing method of the low temperature polysilicon thin film may further include: forming a trap layer on the silicon layer 33 before the silicon layer 33 is annealed to form the polysilicon layer 34. Because the impurities of the substrate 31 may diffuse when being annealed, the trap layer may be provided to trap these impurities and to prevent the impurities form accumulating on the polysilicon layer 34.

In summary, in the method of manufacturing the low temperature polysilicon thin film and the transistor, due to the provision of the amorphous silicon with the recrystallization growth space, the squeeze between the crystals can be eased in the amorphous silicon recrystallization process, and thus the sizes of the protrusions of the surface of the polysilicon layer are significantly smaller. In the preferred case, the aspect ratio of the protrusions is smaller than 0.3 and even smaller than 0.2.

Figure 4A:
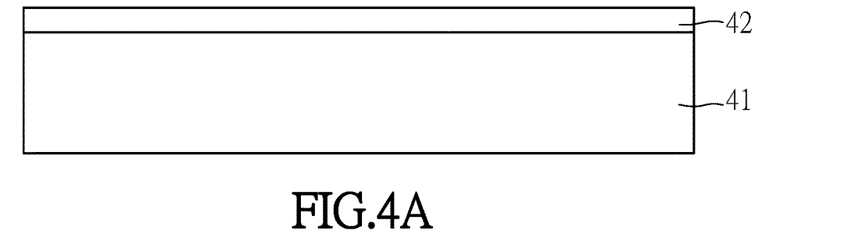
FIGS. 4A to 4E are schematic views showing an embodiment of a method of manufacturing a low temperature polysilicon thin film of this disclosure.

FIGS. 4A to 4E are schematic views showing an embodiment of a method of manufacturing a low temperature polysilicon thin film of this disclosure. As shown in FIG. 4A, the manufacturing method provides a substrate 41, and the substrate 41 is, for example, a glass substrate. Then, a buffer layer 42 is formed on the substrate 41.

Figure 4B:
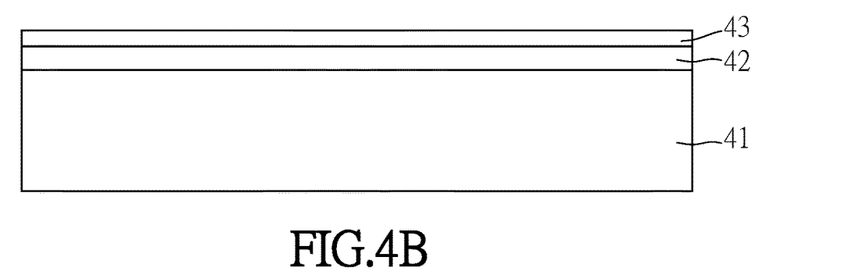
Figure 4C:
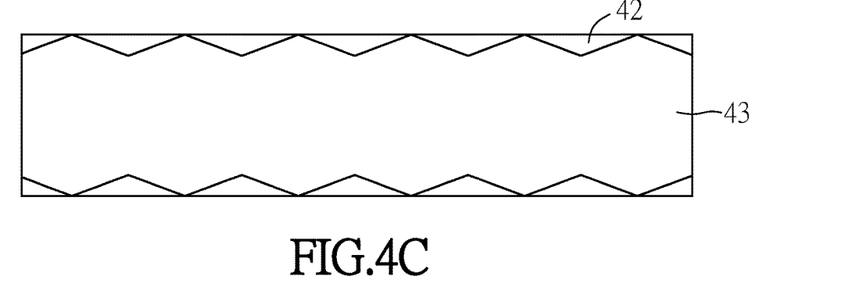

FIG. 4B is a schematic side view showing the low temperature polysilicon thin film, and FIG. 4C is a schematic top view of FIG. 4B. As shown in FIG. 4B, the manufacturing method includes the step of forming a silicon layer 43 on a buffer layer 42, the silicon layer 43 may be deposited on the buffer layer 42 using conventional methods, and the material of the silicon layer 43 is an amorphous silicon. As shown in FIG. 4C, the manufacturing method includes: providing a mask; and patterning the silicon layer 43 through the mask. The patterned silicon layer comprises a plurality of recrystallization growth spaces, and the recrystallization growth spaces are located on the lateral side of the patterned silicon layer. If the silicon layer 43 is viewed from the top of a substrate 41, the buffer layer 42 is seen because the recrystallization growth spaces are located on the lateral side of the patterned silicon layer 43. The recess above the buffer layer 42 and the lateral side of patterned silicon layer 43 form the recrystallization growth space.

For example, the mask pattern is used to define positions of the source, the drain, the trench area and the recrystallization growth space on the silicon layer 43. After the mask pattern is transferred to the silicon layer 43, if the silicon layer 43 is viewed from the top of the substrate 41, the trench area is flatly located between the source and the drain, the recrystallization growth space is located on the lateral side of the trench area of the silicon layer 43, and even the recrystallization growth space may be located on the lateral sides of the source and the drain of the silicon layer 43 at the same time.

In addition, the surface of the silicon layer 43 may be roughened to form uneven surfaces functioning as a recrystallization growth space. Roughening the surfaces of the silicon layer 43 is, for example, etching the surfaces of the silicon layer 43. For example, the surface roughness of the roughened surface ranges from 5 nm to 30 nm. Thus, the upper surface and the side surface of the silicon layer 43 are left with the recrystallization growth space.

Figure 4D:
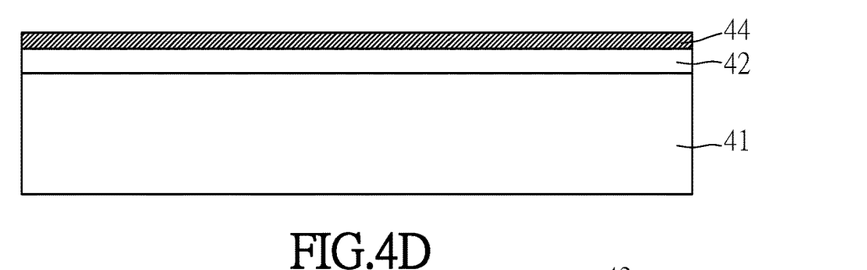

FIG. 4D is a schematic side view showing the low temperature polysilicon thin film, and FIG. 4D is a schematic top view of FIG. 4C. As shown in FIG. 4D, a silicon layer 43 is annealed by the manufacturing method to form a polysilicon layer 44, and a partial silicon material of the polysilicon layer 44 is formed on the recrystallization growth space. Thus, due to the provision of more recrystallization growth spaces, the squeeze between the crystals in the recrystallization process can be relieved and the size of the protrusions on the surfaces of the polysilicon layer 44 can be significantly reduced.

The annealing is, for example, laser annealing. The relevant descriptions of the annealing and recrystallization of amorphous silicon may refer to the relevant contents of FIG. 1C or FIG. 2C, and detailed descriptions thereof will be omitted.

Figure 4E:
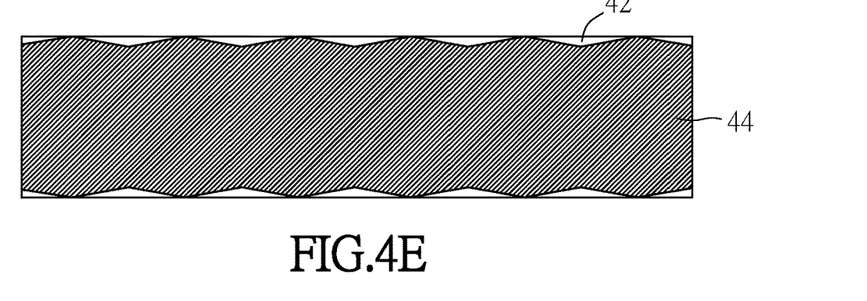

Because the silicon layer 43 itself retains the recrystallization growth space for the recrystallization protrusions, thus, as shown in FIG. 4E, at least the protrusions on the upper surface of the polysilicon layer 44 may be filled into the recrystallization growth space. The aspect ratio of the protrusions of the polysilicon layer of the conventional process is about 0.45, and compared with the conventional process, the aspect ratio of the protrusions of the polysilicon layer 44 can be reduced to be smaller than 0.3, and can even be reduced to be smaller than 0.2 to alleviate the influence of the protrusions on the element performance.

After forming the polysilicon layer 44, the subsequent process may also be performed, as shown in FIG. 1D, to form the thin film transistor. The method of manufacturing a transistor may refer to the relevant description of FIG. 1D, and detailed descriptions thereof will be omitted.

In addition, the buffer layer 42 may also employ the implementation method of FIGS. 1A and 2A.

For example, the buffer layer 42 may also employ the implementation method of FIG. 1A. The surface of the buffer layer 42 has a plurality of pores, and the pores may function as the space for subsequent recrystallization of the silicon layer, and a partial silicon material of the annealed polysilicon layer is filled into the pores. For example, after forming the silicon layer 43 on the buffer layer 42, the manufacturing method may further include roughening the buffer layer 42 to form the pores on the surface of the buffer layer 42. The aperture is smaller than 20 nm, for example. The relevant implementation method may refer to the relevant description of the FIG. 1A, and detailed descriptions thereof will be omitted.

The buffer layer 42 may also employ the implementation method of the FIG. 2A. The step of forming the buffer layer 42 includes: forming a first sub-buffer layer on the substrate 41; and forming a second sub-buffer layer on the first sub-buffer layer, wherein the meticulous degree of the second sub-buffer layer is lower than that of the first sub-buffer layer. The first sub-buffer layer may be a diffusion barrier layer. The relevant implementation method may refer to the relevant description of the FIG. 2A, and detailed descriptions thereof will be omitted.

In summary, in the method of manufacturing the low temperature polysilicon thin film and the transistor, due to the provision of the amorphous silicon with the recrystallization growth space, the squeeze between the crystals can be eased in the amorphous silicon recrystallization process, and thus the sizes of the protrusions of the surface of the polysilicon layer are significantly smaller. In the preferred case, the aspect ratio of the protrusions is smaller than 0.3 and even smaller than 0.2.

In addition, because the aspect ratios of the protrusions of the surface of the polysilicon layer are smaller than 0.3, the properties of the elements may be more consistent. When such a low temperature polysilicon thin film transistor is employed as a switch or driver of a display panel, the color uniformity of the display panel can be better.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A method of manufacturing a low temperature polysilicon thin film, comprising:
    forming a buffer layer on a substrate;
    forming a silicon layer on the buffer layer;
    providing a mask;
    patterning the silicon layer through the mask, wherein the patterned silicon layer comprises a plurality of recrystallization growth spaces; and
    annealing the silicon layer to form a polysilicon layer, and a partial silicon material of the polysilicon layer is formed on the recrystallization growth space, wherein a surface of the buffer layer has a plurality of pores, and a partial silicon material of the polysilicon layer is filled into the pores.

2. The method according to claim 1, wherein a portion of the patterned silicon layer functions as a trench area, and the recrystallization growth spaces are located on a lateral side of the portion.

3. The method according to claim 1, further comprising a step of:
    roughening a surface of the silicon layer to form an uneven surface as another recrystallization growth space.

4. The method according to claim 3, wherein the step of roughening the surface of the silicon layer is to etch the surface of the silicon layer.

5. The method according to claim 1, further comprising a step of:
    roughening the buffer layer to form the pores on the surface of the buffer layer before forming the silicon layer on the buffer layer.

6. The method according to claim 1, wherein the annealing is laser annealing.

7. A method of manufacturing a low temperature polysilicon thin film transistor, comprising:
    forming a buffer layer on a substrate;
    forming a silicon layer on the buffer layer;
    providing a mask;
    patterning the silicon layer through the mask, wherein the patterned silicon layer comprises a plurality of recrystallization growth spaces;
    annealing the silicon layer to form a polysilicon layer, and a partial silicon material of the polysilicon layer is formed on the recrystallization growth space, wherein a surface of the buffer layer has a plurality of pores, and a partial silicon material of the polysilicon layer is filled into the pores;
    forming a gate insulating layer on the polysilicon layer;
    forming a gate on the gate insulating layer; and
    forming a source electrode and a drain electrode, wherein the source electrode and the drain electrode are electrically connected to the polysilicon layer.

8. The method according to claim 7, wherein a portion of the patterned silicon layer functions as a trench area, and the recrystallization growth spaces are located on a lateral side of the portion.

9. The method according to claim 7, further comprising a step of:
    roughening a surface of the silicon layer to form an uneven surface as another recrystallization growth space.

10. The method according to claim 9, wherein the step of roughening the surface of the silicon layer is to etch the surface of the silicon layer.

11. The method according to claim 7, further comprising a step of:
    roughening the buffer layer to form the pores on the surface of the buffer layer before forming the silicon layer on the buffer layer.

12. The method according to claim 7, wherein the annealing is laser annealing.

* * * * *